United States Patent
Mortensen

(10) Patent No.: US 6,594,321 B1
(45) Date of Patent: Jul. 15, 2003

(54) ELECTRICAL CLIPPER

(75) Inventor: Ivar Mortensen, Korntal (DE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/354,818

(22) Filed: Jul. 19, 1999

(30) Foreign Application Priority Data

May 14, 1999 (EP) ............................................. 99440110

(51) Int. Cl.$^7$ ............................................. H04L 27/12
(52) U.S. Cl. ..................................................... 375/295
(58) Field of Search ............................. 375/295, 296, 375/300; 327/311, 312, 309, 317, 332, 552; 455/91, 95, 113, 114, 119, 422, 561

(56) References Cited

U.S. PATENT DOCUMENTS

| | | | | |
|---|---|---|---|---|
| 4,460,871 A | * | 7/1984 | Orban | 327/306 |
| 4,466,122 A | * | 8/1984 | Auerbach | 348/130 |
| 4,737,725 A | * | 4/1988 | Wood | 327/309 |
| 5,350,956 A | * | 9/1994 | Gronroos | 327/309 |
| 5,418,849 A | * | 5/1995 | Cannalire et al. | 379/406.08 |

FOREIGN PATENT DOCUMENTS

| | | |
|---|---|---|
| EP | 0 545 596 A1 | 6/1993 |
| WO | WO 98/44668 | 10/1998 |

OTHER PUBLICATIONS

Meier W. et al.: "Software Amplitude Limitation in Digital Signal Processing APPLICATIONS" Motorola Technical Developments, col. 25, Jul. 1, 1995, pp. 23–27, XP000524322.

* cited by examiner

Primary Examiner—Khai Tran
(74) Attorney, Agent, or Firm—Sughrue Mion, PLLC

(57) ABSTRACT

A method is described of generating an electrical output signal (CFCS) from an electrical input signal (CS) wherein the input signal (CS) is first clipped (12) and then filtered (13) into the output signal (CFCS). The invention is characterized in that the input signal (CS) is clipped dependant on the succeeding filtering. Thereby, a finite power peak capacity of a succeeding amplifier is not exceeded.

14 Claims, 2 Drawing Sheets

ELECTRICAL CLIPPER

BACKGROUND OF THE INVENTION

The invention relates to a method of generating an electrical output signal from an electrical input signal wherein said input signal is first clipped and then filtered into said output signal. The invention also relates to an electrical circuit for generating an output signal from an input signal comprising a clipper and a succeeding filter. Such method and circuit are known from International Patent Application WO 98/44668 A1.

In Direct Sequence Code Division Multiple Access (DS-CDMA) cellular telecommunication systems, a base station communicates with a number of mobile stations. Each link from the base station to one of the mobile stations is assigned to an exclusive channel. This enables the base station to transmit a composite signal to all of the mobile stations. Each of the receiving mobile stations then extracts its dedicated information based on the assigned channel.

The composite signal is put together of samples of the information of the channels. This signal is then input into a pulse shaping filter for creating a pulseform out of the samples. The filtered signal is then amplified. As any amplifier has a finite power peak capacity and as the composite signal may be larger than this capacity, it is possible that the composite signal is distorted.

In order to avoid or at least control such distortion, it is known to introduce a clipper before the amplifier. Such clipper decreases the amplitude of the composite signal if it is above a predefined level. Thereby, the composite signal is limited before it is amplified.

Known clippers which are located before the filter have the disadvantage that two sampled values which are both very little below the predefined level to be clipped may constitute a shaped signal after the filter which is above this level so that the amplifier exceeds its finite power peak capacity.

Clipping after the filter has the disadvantage that: out-of-band noise is generated and thereby the criteria of adjacent channel protection is violated.

To avoid these disadvantages, WO 98/44668 A1 proposes to estimate a peak-reducing waveform and to sum it with the composite signal in order to reduce the peak-to-average power ratio of the composite signal. However, this method requires complex electrical circuits with a remarkable expenditure.

SUMMARY OF THE INVENTION

It is therefore an object of the invention to provide a method and an electrical circuit which guarantee not to exceed the finite power peak capacity of the amplifier without being complex or costly.

For a method or an electrical circuit as described above, this object is solved according to the invention by said input signal being clipped dependant on said succeeding filtering.

According to the invention, the clipping is matched to the filtering, or, in other words, the clipping includes some kind of prediction with respect to the filtering. The dependency according to the invention guarantees that the clipped signal will not exceed the finite power peak capacity of the amplifier, not only after the clipper but also after the filter. Therefore, it is not possible anymore that a clipped signal becomes a shaped signal after the filter which exceeds the predefined level. This negative possibility is avoided by performing the clipping dependant on the filtering.

In a preferred embodiment of the invention, said filtering is modeled before said clipping and said input signal is clipped dependant on said modeling. The modeling of the filter is performed by introducing the coefficients of the filter into the clipper. Thereby, without requiring a complex electrical circuit, the dependency of the filtering may be realized within the clipper. Even more, the clipper according to the invention may easily be integrated into the pulse-shaping filter so that a low-cost integrated circuit may be produced.

In another preferred embodiment of the invention, said input signal is clipped such that said output signal does not exceed the predefined level. Due to the introduction of the coefficients of the filter into the clipper, it is possible to limit not only the signal produced by the clipper itself, but also the signal produced by the succeeding filter. As already mentioned, this guarantees that the succeeding amplifier does not run into its finite power peak capacity.

BRIEF DESCRIPTION OF THE DRAWINGS

Further embodiments as well as further advantages of the invention are outlined in the following description of the enclosed figures.

DETAILED DESCRIPTION OF THE INVENTION

Figure 1:
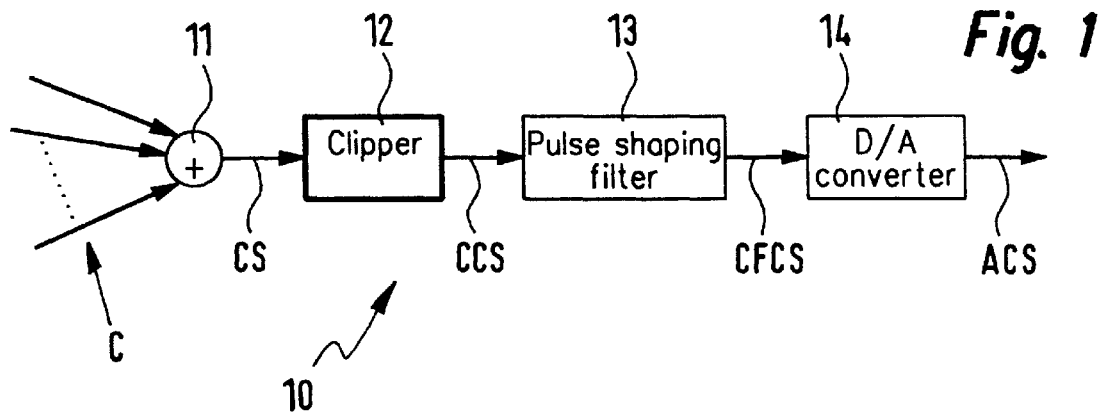
FIG. 1 shows a schematic block diagram of an embodiment of an electrical circuit according to the invention.

FIG. 1 shows a part of an electrical circuit 10 of a transmitter of a radio base station of a DS-CDMA cellular telecommunication system.

In this circuit 10, the information of a number of channels C is summed in a summer 11 to generate a composite signal CS. The composite signal CS is input to a clipper 12 which produces a clipped composite signal CCS. Then, the clipped composite signal CCS is input to a pulse shaping filter 13 which generates a clipped and filtered composite signal CFCS. The clipped and filtered composite signal CFCS is input into a digital-to-analog converter 14 which produces an analog composite signal ACS which is then passed to a not-shown amplifier.

The composite signal CS may also be recognized as an input signal and the clipped and filtered composite signal CFCS or the analog composite signal ACS may be recognized as an output signal.

The composite signal CS consists of digital sample values of the information of the respective channels. These sample values are depicted in FIG. 2 by crosses 20.

According to the prior art, these sample values 20 are not clipped by the clipper 12 for generating the clipped composite signal CCS as long as they do not exceed a predefined level. This level is shown in FIG. 2 as a dotted line 21. The level 21 is predefined such that any signal below this level 21 is amplified by the succeeding amplifier linearly, i.e. without the amplifier running into its finite power peak capacity.

Figure 2:
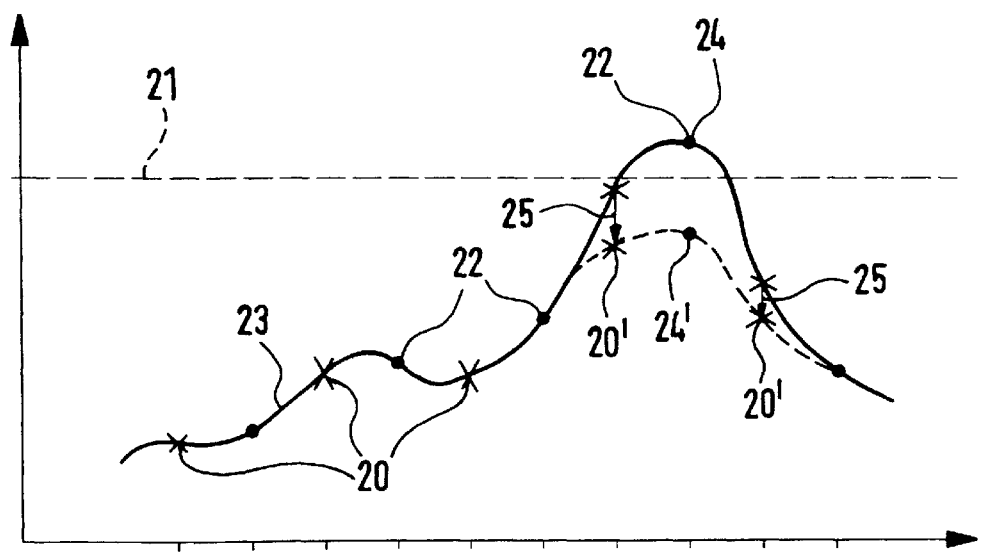
FIG. 2 shows a schematic time diagram of examples of signals of the circuit of FIG. 1.

As none of the sample values 20 actually exceeds the predefined level 21 in FIG. 2, there is no clipping in connection with the shown example according to the prior art.

The succeeding filter 13 then introduces additional values in between the sample values 20 in order to produce the clipped and filtered composite signal CFCS. For the purpose of explanation, it is assumed that there is one sample per time unit before the filter 13 and two samples per time unit after the filter 13.

The additional values are depicted in FIG. 2 as dots 22. The filter 13 introduces the additional values 22 such that the sample values 20 and the addtitional values 22 create a pulse shape which represents the inputted information as good as possible. For the purpose of explanation, the inputted information is shown in FIG. 2 as a line 23.

As can be seen from FIG. 2, one of these additional values 22 exceeds the predefined level 21. This value carries the reference number 24.

As a consequence, on the basis of the clipper 12 according to the prior art and due to the additional value 24, the clipped and filtered composite signal CFCS exceeds the predefined level 21 and therefore the amplifier succeeding the digital-to-analog converter 14, runs into its finite power peak capacity arid does therefore not perform a linear amplification anymore. This results in a distortion of the clipped and filtered composite signal CFCS according to the prior art.

According to the invention, the clipper 12 is dependant on the filter 13. This means that the clipper 12 is clipping the composite signal CS depending on the succeeding filtering of the filter 13.

For that purpose, the clipper 12 is modeling the filter 13. This means that the clipper 12 simulates the filtering of the filter 13, of course, without actually filtering the composite signal CS. Then, the clipper 12 compares the resulting simulated filtered signal with the predefined level 21. If the simulated filtered signal exceeds this level 21, the clipper 12 limits the composite signal CS. Then, the clipped composite signal CCS is inputted in the filter 13 for filtering.

In FIG. 2, the clipper 12 is modeling the additional values 22 which would be introduced by the succeeding filter 13 if the clipper 12 would not limit any of the sample values 20. This modeling is performed in the same way as the filter 13 would do it. As a result, the clipper 12 is modeling, among others, the additional value 24.

Then, the clipper 12 recognizes that this additional value 24 exceeds the predefined level 21. Due to this result, the clipper 12 limits the sample values 20 in such a manner that the additional value 24 does not exceed anymore the predefined level 21 after filtering.

As an example, it is shown in FIG. 2 that the clipper 12 limits those two sample values 20 which are located adjacent to the exceeding additional value 24. The limitation of these two sample values 20 is depicted with two arrows 25 and with two clipped sample values 20' in FIG. 2.

Then, the clipped composite signal CCS including the two clipped sample values 20' is inputted to the filter 13. Due to the clipping of the two adjacent sample values 20', the filter 13 generates an additional value 24' which does not exceed the predefined level 21 anymore. This is illustrated in FIG. 2 by a clipped and filtered composite signal CFCS including this additional value 24'.

Figure 3:
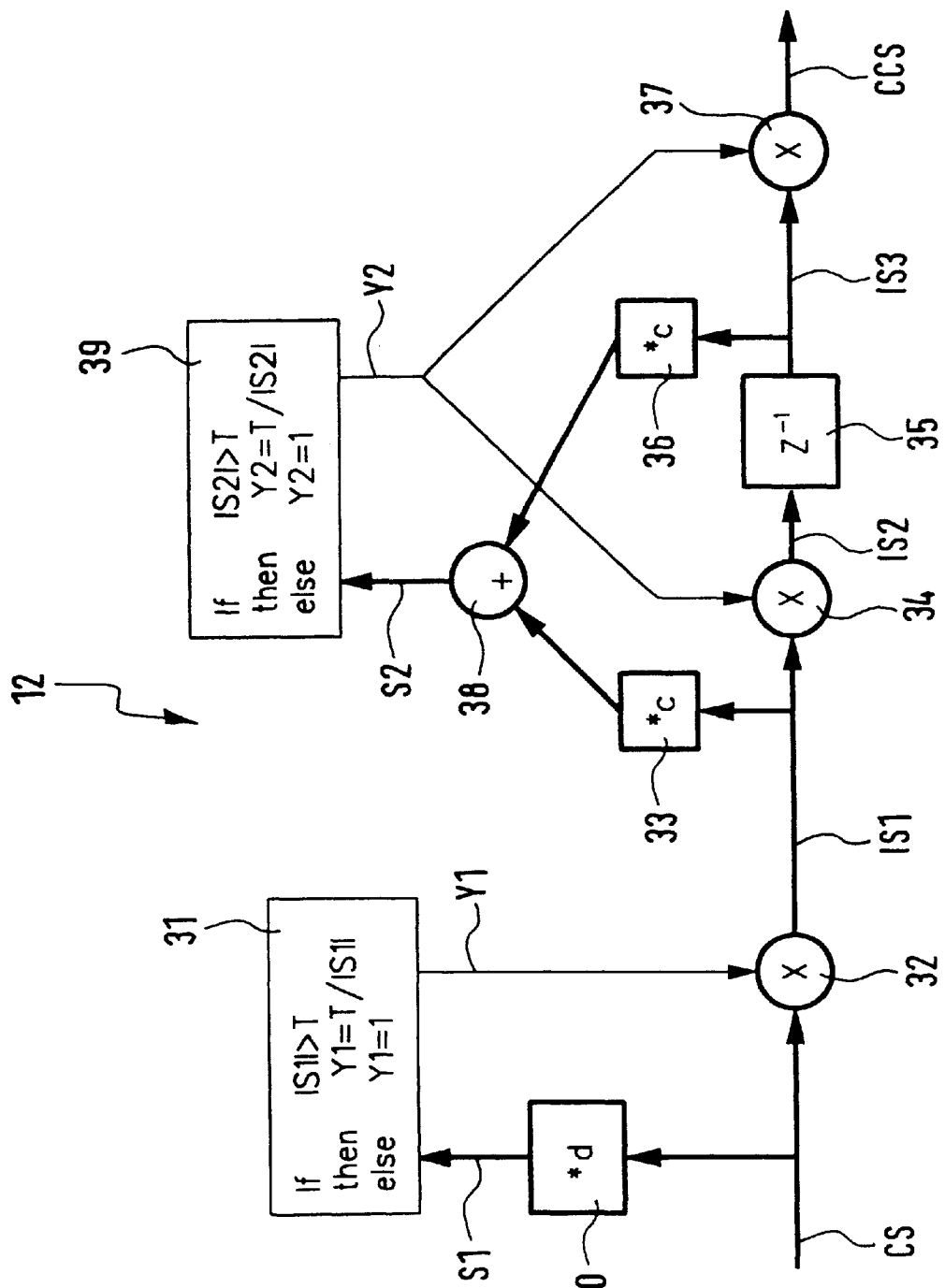
FIG. 3 shows a schematic block diagram of an embodiment of a clipper to be used in the circuit of FIG. 1.

FIG. 3 shows an example of the clipper 12. For the purpose of explanation it is assumed that the filter 13 is symmetrical and that the filter length of the filter 13 is "3" so that the filter 13 may be described with three coefficients c, d and c. If the filter 13 is of a higher order, the coefficients may be approximated. As already mentioned, it is also assumed that there is one sample per time unit before the filter 13 and two samples per time unit after the filter 13.

According to FIG. 3, the composite signal CS is multiplied in a block 30 with the coefficient d of the filter 13. The result is a value S1, which is then compared with a value T in a block 31. The value T is identical with the predefined level 21 in FIG. 2.

If $|S1|$ is greater than T, then a signal Y1 is produced which is calculated as follows:

$$Y1 = T/|S1|$$

If $|S1|$ equals T or is less than T, then it follows:

$$Y1 = 1$$

A multiplication is performed in a block 32. There, the composite signal CS is multiplied with Y1 resulting in a first intermediate signal IS1. This signal IS1 is smaller or at least equal to the composite signal CS. This means in other words that the composite signal CS is limited depending on the coefficient d of the filter 13.

Then, the first intermediate signal IS1 is multiplied in a block 33 with the coefficient c of the filter 13. A multiplication is performed in a succeeding block 34 resulting in a second intermediate signal IS2 which is then input to a delaying block 35. There, the second intermediate signal IS2 is delayed for one time unit. The resulting third intermediate signal IS3 is multiplied in a block 36 with the coefficient c of the filter 13. A multiplication is performed in a succeeding block 37 resulting in the clipped composite signal CCS.

The outputted signals from the two blocks 33 and 36 are added in an adder 38. The result is a value S2, which is then compared with the value T in a block 39.

If $|S2|$ is greater than T, then a signal Y2 is produced which is calculated as follows:

$$Y2 = T/|S2|$$

If $|S2|$ equals T or is less than T, then it follows:

$$Y2 = 1$$

Then, the signal Y2 is inputted into the two multiplication blocks 34 and 37 thereby influencing the generation of the clipped composite signal CCS.

As similarly described above, the clipped composite signal CCS is smaller or at least equal to the first intermediate signal IS1. This means in other words that the first intermediate signal IS1 and therefore the composite signal CS is limited depending on the coefficients c of the filter 13.

By introducing the coefficients c, d and c of the filter 13 into the clipper 12, the filter 13 is modeling within the clipper 12. This means that the clipping of the composite signal CS is performed such that not only the clipped composite signal CCS, but also the filtered and clipped composite signal CFCS does riot exceed the value T, i.e. the predefined level 21 of FIG. 2.

The thick lines in FIG. 3 represent complex signals whereas the thin lines represent real signals. As it is shown in FIG. 3, the blocks 31 and 39 depend on complex signals and produce real signals. Thereby, the clipper 12 realizes a so-called circular clipping.

What is claimed is:

1. A method of generating an electrical output signal (CFCS) from an electrical input signal (CS) comprising:

clipping and then filtering said input signal (CS) to generate said output signal (CFCS), wherein said input signal (CS) is clipped dependant on a modeling of said succeeding filtering.

2. The method of claim 1, wherein said modeling of said succeeding filtering comprises:

introducing coefficients of the succeeding filtering, without actually filtering the input signal CS, before said clipping.

3. The method of claim 1, comprising:

clipping said input signal (CS) such that said output signal (CFCS) does not exceed a predefined level (21).

4. An electrical circuit (10) for generating an output signal (CFCS) from an input signal (CS) comprising:

a clipper (12), and a succeeding filter (13), wherein said clipper (12) is dependant on a modeling of said filter (13).

5. The circuit (10) of claim 4, wherein said clipper (12) is dependant on filter coefficients (c, d, c) of said succeeding filter (13).

6. The circuit (10) of claim 4, wherein said clipper (12) is dependent on a predefined level (21) which is not to be exceeded by said output signal (CFCS).

7. A radio base station of a telecommunication system including an electrical circuit (10) for generating an output signal (CFCS) from an input signal (CS) comprising a clipper (12) and a succeeding filter (13), wherein said clipper (12) is dependent on a modeling of said filter (13).

8. A transmitter of a telecommunication system including an electrical circuit (10) for generating an output signal (CFCS) from an input signal (CS) comprising a clipper (12) and a succeeding filter (13), wherein said clipper (12) is dependant on a modeling of said filter (13).

9. A circuit that generates an electrical output signal (CFCS) from an electrical input signal (CS) comprising:

means for clipping said input signal (CS), means for filtering said input signal (CS), and means for modeling said filtering, wherein said input signal (CS) is clipped dependant on said means for modeling said filtering.

10. The circuit of claim 9, wherein said means for modeling said filtering comprises:

means for introducing coefficients of the succeeding filtering, without actually filtering the input signal CS, before said clipping.

11. The circuit of claim 9, wherein said means for clipping comprising:

clipping said input signal (CS) such that said output signal (CFCS) does not exceed a predefined level (21).

12. A method of generating an electrical output signal from an electrical input signal comprising:

simulating a filtering operation;

clipping said input signal based on said simulation, and performing the filtering operation to generate said output signal.

13. The method of claim 12, wherein said simulating of the filtering operation comprises:

introducing coefficients of the filtering operation, without actually filtering the input signal.

14. The method of claim 13, further comprising:

clipping said input signal such that said output signal does not exceed a predefined level.

* * * * *